(12) United States Patent
Coronel et al.

(10) Patent No.: US 7,687,356 B2
(45) Date of Patent: Mar. 30, 2010

(54) FORMATION OF SHALLOW SIGE CONDUCTION CHANNEL

(75) Inventors: Philippe Coronel, Barraux (FR); Arnaud Pouydebasque, Eindhoven (NL)

(73) Assignee: STMicroelectronics Crolles 2 SAS, Crolles (FR)

( * ) Notice: Subject to any disclaimer, the term of this patent is extended or adjusted under 35 U.S.C. 154(b) by 0 days.

(21) Appl. No.: 11/714,063

(22) Filed: Mar. 5, 2007

(65) Prior Publication Data

US 2007/0275513 A1 Nov. 29, 2007

(30) Foreign Application Priority Data

Mar. 6, 2006 (EP) .................................. 06300203

(51) Int. Cl.
*H01L 21/336* (2006.01)
(52) U.S. Cl. ........................ 438/285; 438/439; 438/400; 438/410; 438/300; 438/162; 438/166; 438/486; 438/528; 438/149; 438/290; 438/199; 257/411; 257/412; 257/413; 257/347; 257/348; 257/616; 257/368; 257/E21.102; 257/E21.562; 257/E21.619; 257/E29.193; 257/E21.001
(58) Field of Classification Search ................. 438/151, 438/285
See application file for complete search history.

(56) References Cited

U.S. PATENT DOCUMENTS

| | | | | |
|---|---|---|---|---|
| 5,710,450 A * | 1/1998 | Chau et al. | .................... | 257/344 |
| 5,905,285 A * | 5/1999 | Gardner et al. | ............... | 257/344 |
| 6,150,221 A * | 11/2000 | Aoyama | ...................... | 438/300 |
| 6,251,751 B1* | 6/2001 | Chu et al. | .................... | 438/439 |
| 6,252,284 B1* | 6/2001 | Muller et al. | ............... | 257/412 |
| 6,271,566 B1* | 8/2001 | Tsuchiaki | .................... | 257/347 |
| 6,403,433 B1* | 6/2002 | Yu et al. | ...................... | 438/300 |
| 6,406,973 B1* | 6/2002 | Lee | .............................. | 438/416 |
| 6,479,358 B1* | 11/2002 | Yu | .............................. | 438/300 |
| 6,599,803 B2* | 7/2003 | Weon et al. | .................. | 438/300 |
| 6,730,576 B1* | 5/2004 | Wang et al. | .................. | 438/413 |
| 6,825,102 B1* | 11/2004 | Bedell et al. | ................. | 438/486 |
| 6,881,635 B1* | 4/2005 | Chidambarrao et al. | ...... | 438/300 |

(Continued)

FOREIGN PATENT DOCUMENTS

EP 1 548 687 A1 6/2005

(Continued)

OTHER PUBLICATIONS

European Search Report from European Patent Application 06300203.4, filed Mar. 6, 2006.

(Continued)

*Primary Examiner*—Fernando L Toledo
*Assistant Examiner*—Ankush K Singal
(74) *Attorney, Agent, or Firm*—Lisa K. Jorgenson; James H. Morris; Wolf, Greenfield & Sacks, P.C.

(57) ABSTRACT

A method of forming a silicon germanium conduction channel under a gate stack of a semiconductor device, the gate stack being formed on a silicon layer on an insulating layer, the method including growing a silicon germanium layer over said silicon layer and heating the device such that germanium condenses in the silicon layer such that a silicon germanium channel is formed between the gate stack and the insulating layer.

14 Claims, 2 Drawing Sheets

U.S. PATENT DOCUMENTS

| | | | | |
|---|---|---|---|---|
| 6,917,096 | B2 * | 7/2005 | Sugiyama et al. | 257/616 |
| 6,977,400 | B2 * | 12/2005 | Puchner et al. | 257/213 |
| 6,989,570 | B2 * | 1/2006 | Skotnicki et al. | 257/347 |
| 7,018,901 | B1 * | 3/2006 | Thean et al. | 438/285 |
| 7,118,977 | B2 * | 10/2006 | Chidambaram et al. | 438/300 |
| 7,175,709 | B2 * | 2/2007 | Tsai et al. | 117/86 |
| 7,193,279 | B2 * | 3/2007 | Doyle et al. | 257/401 |
| 7,202,145 | B2 * | 4/2007 | Cao | 438/509 |
| 7,288,443 | B2 * | 10/2007 | Zhu | 438/149 |
| 7,306,997 | B2 * | 12/2007 | Xiang et al. | 438/300 |
| 7,335,545 | B2 * | 2/2008 | Currie | 438/197 |
| 7,455,998 | B2 * | 11/2008 | Brandstadt et al. | 435/131 |
| 7,456,087 | B2 * | 11/2008 | Cheng | 438/584 |
| 2002/0089003 | A1 * | 7/2002 | Lee | 257/288 |
| 2003/0003679 | A1 * | 1/2003 | Doyle et al. | 438/406 |
| 2004/0094805 | A1 * | 5/2004 | Hokazono et al. | 257/382 |
| 2004/0188760 | A1 * | 9/2004 | Skotnicki et al. | 257/347 |
| 2004/0206950 | A1 * | 10/2004 | Suvkhanov et al. | 257/19 |
| 2004/0214407 | A1 * | 10/2004 | Westhoff et al. | 438/459 |
| 2004/0248369 | A1 * | 12/2004 | Wang et al. | 438/305 |
| 2005/0093154 | A1 | 5/2005 | Kottantharayil et al. | |
| 2005/0112857 | A1 * | 5/2005 | Gluschenkov et al. | 438/585 |
| 2005/0116297 | A1 * | 6/2005 | Ryu et al. | 257/369 |
| 2005/0236668 | A1 * | 10/2005 | Zhu et al. | 257/347 |
| 2005/0285192 | A1 * | 12/2005 | Zhu | 257/347 |
| 2005/0287752 | A1 * | 12/2005 | Nouri et al. | 438/303 |
| 2006/0024963 | A1 * | 2/2006 | Yue et al. | 438/664 |
| 2006/0068553 | A1 * | 3/2006 | Thean et al. | 438/285 |
| 2006/0160314 | A1 * | 7/2006 | Arghavani | 438/285 |
| 2006/0208320 | A1 * | 9/2006 | Tsuchiya et al. | 257/371 |
| 2006/0258073 | A1 * | 11/2006 | Greene et al. | 438/199 |
| 2006/0267046 | A1 * | 11/2006 | Numata | 257/192 |
| 2007/0020874 | A1 * | 1/2007 | Xie et al. | 438/423 |
| 2007/0117282 | A1 * | 5/2007 | Saito et al. | 438/149 |
| 2007/0187767 | A1 * | 8/2007 | Yasutake | 257/368 |
| 2007/0257249 | A1 * | 11/2007 | Mocuta et al. | 257/19 |
| 2007/0275548 | A1 * | 11/2007 | Lavoie et al. | 438/597 |

FOREIGN PATENT DOCUMENTS

JP   20044363198   * 12/2004

OTHER PUBLICATIONS

Maeda et al.: "Thin-body Ge-on-insulator p-channel MOSFETs with Pt germanide metal source/drain" Thin Solid Films, Elsevier-Sequoia S.A. Lausanne, CH, vol. 508, No. 1-2, Nov. 15, 2005, pp. 346-350, XP005401443 ISSN: 0040-6090.

Tezuka T. et al.: "Novel fully-depleted SiGe-on-insulator pMOSFETs with high-mobility SiGe surface channels" International Electron Devices Meeting 2001. IEDM. Technical Digest. Washington, DC, Dec. 2-5, 2001, New York, NY: IEEE, US, Dec. 2, 2001, pp. 3361-3363, XP010575278 ISBN: 0-7803-7050-3.

Zengfeng Di et al.: "Letter to the Editor; Interfacial characteristics of fully depleted SiGe-on-insulator (SGOI) substrate fabricated by modified Ge condensation; Letter to the Editor", Emiconductor Science and Technology, IOP, Bristol, GB, vol. 20, No. 8, Aug. 1, 2005, pp. L31-L35, XP020086601 ISSN: 0268-1242.

Tezuka T. et al.: "High-Mobility Strained Sige-On-Insulator PMOSFETS With Ge-Rich Surface Channels Fabricated by Local Condensation Technique" IEEE Electron Device Letters, IEEE Service Center, New York, NY, US, vol. 26, No. 4, Apr. 2005 pp. 243-245, XP001230451 ISSN: 0741-3106.

* cited by examiner

FORMATION OF SHALLOW SIGE CONDUCTION CHANNEL

BACKGROUND OF THE INVENTION

1. Field of the Invention

The present invention relates to the formation of a conduction channel for a semiconductor device, and in particular to the formation of an ultra-thin silicon germanium conduction channel.

2. Discussion of the Related Art

In the development of new MOS (Metal Oxide Semiconductor) technologies, a key aim is to improve the mobility in the channel of the device. To achieve this, the use of materials with an improved mobility when compared to silicon has been considered, for example using materials such as germanium, GaAs, or silicon germanium with or without additional strain.

There is also a desire in current MOS technologies to allow the control of short channel effects. In bulk silicon, this requires the formation of ultra-shallow junctions, for example junctions having thicknesses of less than 10 nanometers for 20 nanometer devices, and this is hard to achieve. Another option is the use of thin silicon films on insulator (typically less than 15 nm) in a fully depleted structure.

In order to produce a silicon germanium device, a full sheet epitaxy of silicon germanium is generally formed on a silicon substrate. However, this technique results in a silicon germanium layer which is too thick, and thus is not compatible with thin body devices.

Another consideration when forming a MOS transistor is the formation of the insulating oxide layer in the gate stack, the thickness of which needs to be accurately controlled.

There is thus a need for a method of forming a silicon germanium channel sufficiently thin to achieve an ultra-shallow junction, and at the same time to allow the precise formation of the insulating layer in the gate stack.

SUMMARY OF THE INVENTION

Embodiments of the present invention aim to at least partially address the above mentioned needs.

According to one aspect of the present invention, there is provided a method of forming a silicon germanium conduction channel under a gate stack of a semiconductor device, the method comprising the successive steps of: forming the gate stack being formed on a silicon layer formed on an insulating layer; the method comprising: growing a silicon germanium layer over said silicon layer; and heating the device so that germanium condenses in said silicon layer such that a silicon germanium channel is formed across the entire channel of the device between said gate stack and said insulating layer.

According to one embodiment of the present invention the method further comprises the step of forming a second silicon layer over said silicon germanium layer directly after the growing step.

According to one embodiment of the present invention, the silicon layer has a thickness of less than 20 nm.

According to another embodiment of the present invention, the fraction of germanium in the silicon germanium layer is between 20 and 50 percent.

According to yet another embodiment, the thickness and germanium concentration of the silicon germanium layer are chosen to satisfy the following relation:

$$X_0 \cdot T_i = X \cdot (L_g/2 + L_{sp})$$

wherein $X_0$ is the germanium fraction in the silicon germanium layer, $T_i$ is the thickness of the silicon germanium layer, $X$ is the germanium fraction in the silicon germanium channel, $L_g$ is the gate length of said gate stack and $L_{sp}$ is the width of one of said spacers.

According to another embodiment of the present invention, the gate stack comprises an insulating layer in contact with said silicon layer and the silicon germanium layer is for example between 50 and 100 nm in thickness.

BRIEF DESCRIPTION OF THE DRAWINGS

The foregoing and other purposes, features, aspects and advantages of the invention will become apparent from the following detailed description of a number of embodiments which is given by way of illustration only without limiting the invention, and throughout which reference is made to the accompanying drawings in which.

For reasons of clarity, the same elements in the figures have been referenced with the same reference numbers throughout the figures. Furthermore, as is usual with the representation of integrated circuits, the figures have not been drawn to scale.

DETAILED DESCRIPTION

A process will now be described for forming a silicon germanium ultra-thin channel.

Figure 1A:
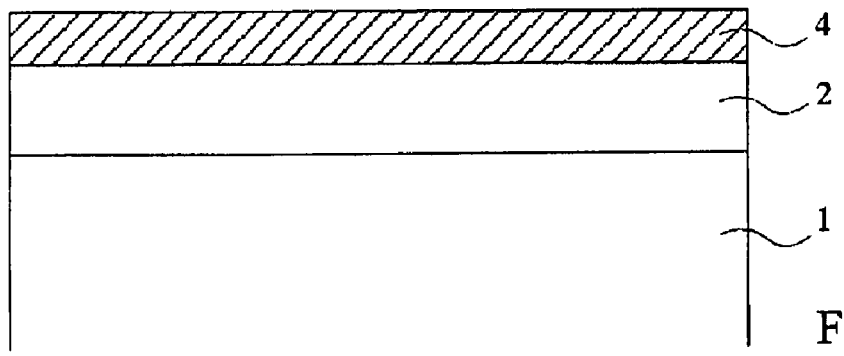
FIGS. 1A to 1E illustrate successive steps in a process for forming a shallow silicon germanium channel under a gate.

As shown in FIG. 1A, a silicon on insulator (SOI) wafer is used. Such a wafer comprises a silicon wafer 1 covered with a silicon oxide layer 2 and a layer 4 of crystalline silicon formed over the silicon oxide layer 2. The silicon layer 4 is, for example, approximately 15 nm in thickness.

Figure 1B:
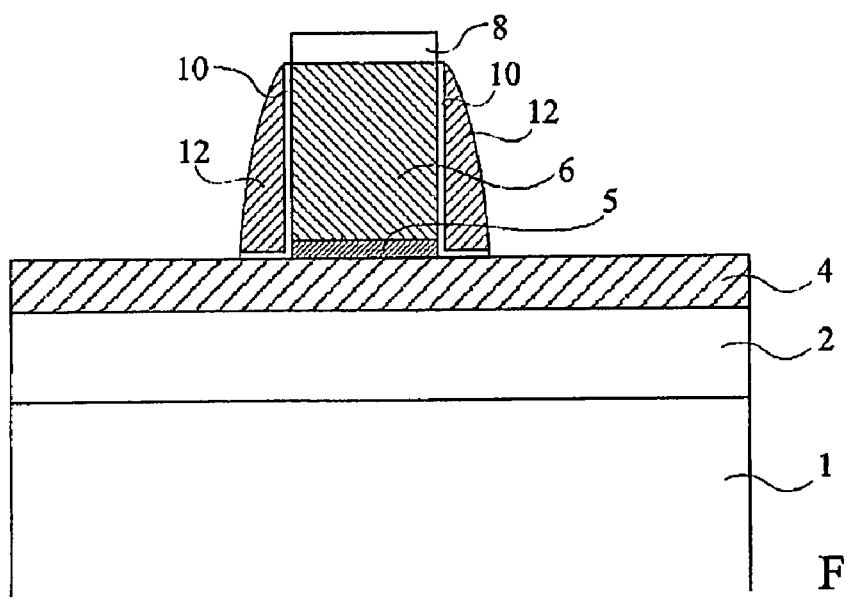

Next, with reference to FIG. 1B, a gate stack 6 is formed on the silicon layer 4, the gate stack being formed of, for example, a gate oxide 5, and a polysilicon and/or a metal silicide layer 6. The gate stack has a gate length of for example approximately 40 nm. The gate stack is, for example, approximately 100 nm in thickness. An oxide layer 8 covers the gate stack 6. Oxide layer 8 is, for example, the remainder of a mask used in a previous step for the formation of the gate stack. The gate stack 6 comprises spacers formed of either side of the polysilicon/silicide layer 6, and are formed of, for example, thin layers of silicon oxide 10 and portions of silicon nitride 12. Each spacer is approximately 15 nm in width.

Figure 1C:
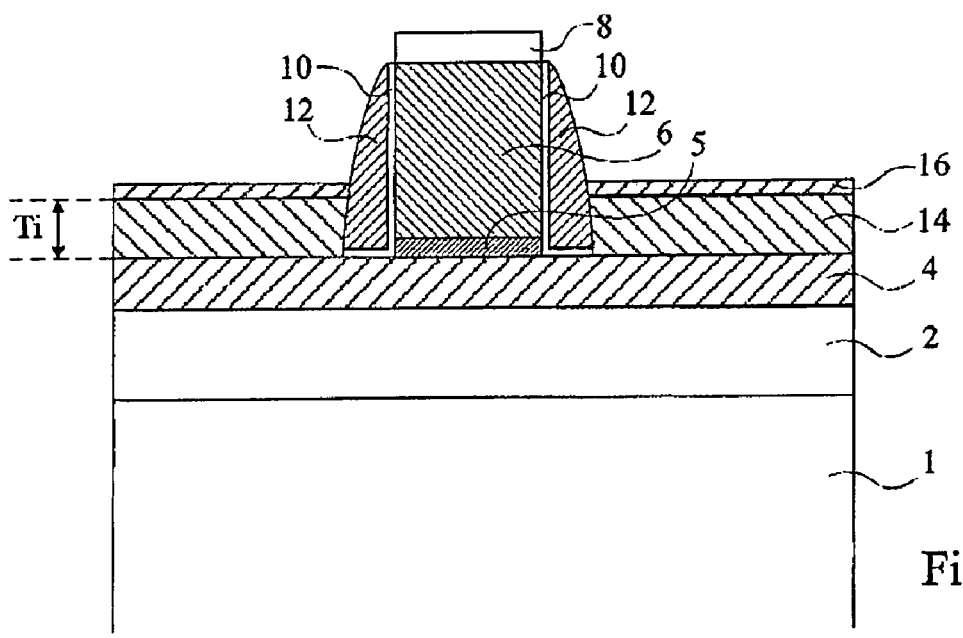

With reference to FIG. 1C, a selective SiGe epitaxial growth is performed to form a silicon germanium (SiGe) layer 14 on the silicon layer 4 around the gate stack. The SiGe layer 14 is for example approximately 70 nm in thickness. The germanium fraction in the SiGe layer 14 is for example 30 percent. A thin silicon layer 16 is then formed over the silicon germanium layer 14.

Figure 1D:
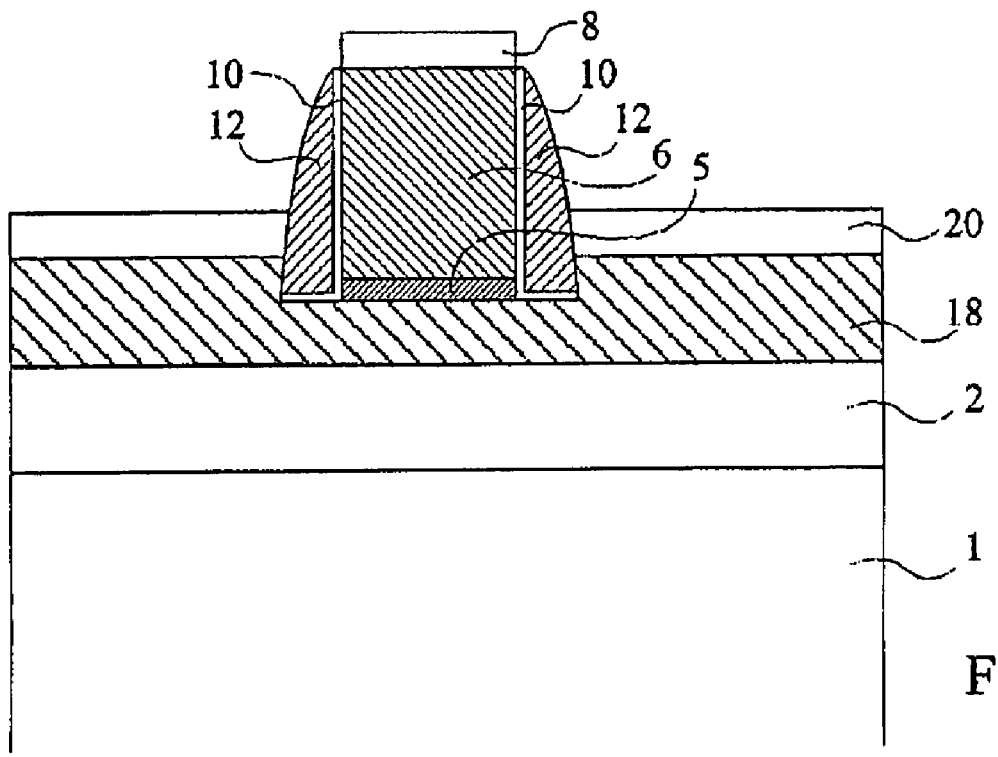

With reference to FIG. 1D, silicon germanium condensation is then performed, by heating the device to approximately 1050° C. in an oxidizing atmosphere. This process drives the germanium from the silicon germanium layer 14 into the silicon layer 4, while a silicon oxide layer grows from the upper surface of the silicon layer 16. The temperature and duration of the condensation process is controlled such that a SiGe layer is formed across the entire channel of the device, under the gate. The newly formed SiGe layer is shown in FIG. 1D labelled 18, along with the silicon oxide layer 20 which is present over the SiGe layer.

Figure 1E:
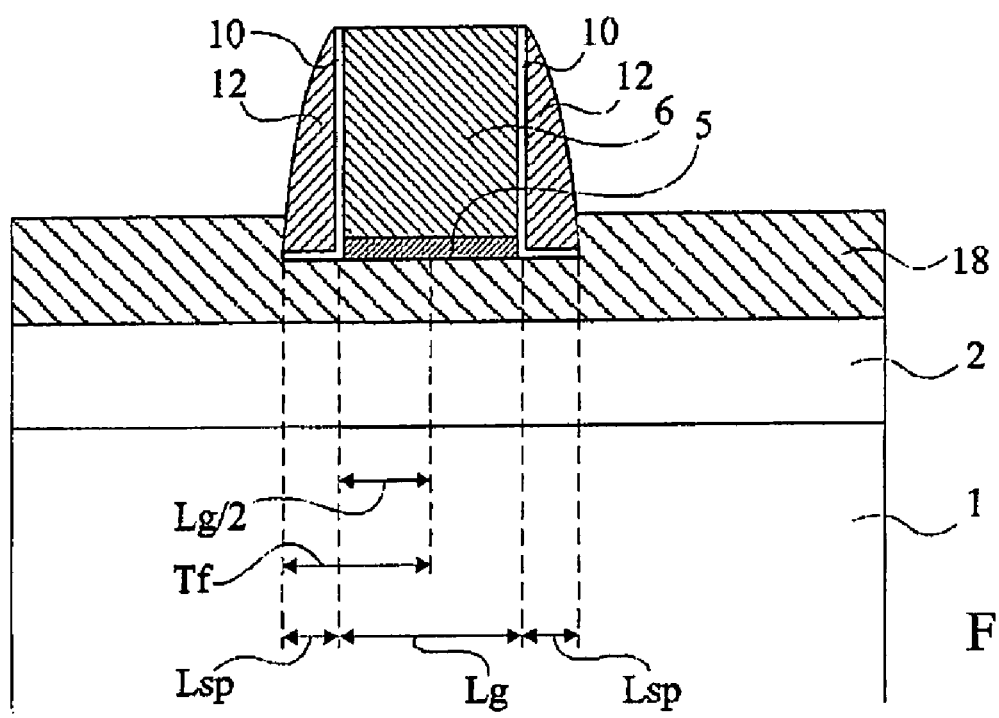

Next, as shown in FIG. 1E, the silicon oxide layer 20 and the oxide layer 8 over the gate stack are removed by etching.

The SiGe layer 18 thus forms a conduction channel under the gate stack where the silicon layer 4 was previously present. The channel has thus the thickness of the previously formed silicon layer 4, for example 10-15 nm. The fraction of germanium in the newly formed SiGe layer 18 is determined by the following equation:

$$X = X_0(T_i/T_f)$$

in which X is the final Ge fraction in layer 18, $X_0$ is the initial Ge fraction in SiGe layer 14, $T_i$ is the initial SiGe thickness of layer 14 and $2T_f$ is the total length under the gate stacks. Thus $T_f$ can be considered as:

$$T_f = L_g/2 + L_{sp}$$

wherein $L_g$ is the gate length (for example 40 nm) and $L_{sp}$ is the width of each spacer (for example 15 nm). This is because after condensation, SiGe needs to be formed under the gate stack, and thus the final length required for the complete channel to be formed is half the gate length plus the width of one spacer. This is the case for thin silicon devices that are to have a final SiGe layer thinner than $L_g/2 + L_{sp}$. Thus given an initial SiGe layer thickness ($T_i$) of 70 nm, a total length under the gate stack ($2T_f$) of 70 nm, and an initial Ge fraction ($X_0$) of 0.3, the final Ge fraction in the gate will be approximately 0.6 or 60 percent.

Thus a process has been described for forming a thin or ultra-thin SiGe channel in a device. Advantageously as this process only requires a thin silicon layer initially, the process is straightforward and non-expensive to implement. The resulting SiGe channel has high performance due to the improved mobility resulting from the germanium enriched channel, and can be formed as a thin film device, allowing better control of short channel effects.

Due to the fact that this method is applied after the formation of the gate stack, the insulating oxide layer is formed from a silicon layer and not from an SiGe layer and thus can be formed with the required precision.

Furthermore, the thickness of the SiGe channel can be accurately controlled as it will have the thickness of the initial silicon layer formed under the gate stack.

This technique may be applied to any type of architecture, such as planar, gate-all-around or FinFET (Fin Field Effect Transistor) architectures, as the condensation takes place from the region around the gate stack of the device. It can be applied to all CMOS devices, and to single or double gate devices. Furthermore the technique is applicable to any type of substrate.

While example embodiments have been described, it will be apparent to those skilled in the art that there are numerous variations that could be applied.

While the example of the formation of one device has been provided, in practice a large number of devices can be fabricated according to the present method at the same time.

The dimensions have been given by way of example only, and in fact the method described herein is applicable to a wide range of device sizes. However, in general, the ratio between the germanium fraction $X_0$ in the initial silicon germanium layer and the final germanium fraction X in the SiGe channel should equal the ratio between the thickness of the initial SiGe layer $T_i$ and half the length under gate stack $T_f$, which is taken to be half the gate length plus the width of one spacer. In other words, the following relationship preferably holds:

$$X_0 \cdot T_i = X \cdot (L_g/2 + L_{sp})$$

wherein $X_0$ is the germanium fraction in the silicon germanium layer, $T_i$ is the thickness of the silicon germanium layer, X is the germanium fraction in the silicon germanium channel, $L_g$ is the gate length of said gate stack and $L_{sp}$ is the width of one of said spacers.

The thickness of the initial SiGe layer 14 is given by way of example as being 70 nm, but in alternative embodiments is preferably in the range of 50 to 100 nm. The fraction of germanium in the initial SiGe layer is given by way of example as being 30 percent, but in alternative embodiments is preferably in the range of 20 to 50 percent.

While the example has been given of forming the device from a SOI wafer, the invention applies to any structure wherein a thin silicon layer covers an insulator.

While a particular example of the spacers of the gate stack has been described, in alternative embodiments alternative spacer structures could be used, comprising alternative materials, and with or without the silicon oxide layer 10.

While a silicon layer 16 has been described as being formed over the SiGe layer 14, in alternative embodiments, no silicon layer 16 is provided.

Having thus described at least one illustrative embodiment of the invention, various alterations, modifications and improvements will readily occur to those skilled in the art. Such alterations, modifications and improvements are intended to be within the scope of the invention. Accordingly, the foregoing description is by way of example only and is not intended to be limiting. The invention is limited only as defined in the following claims and the equivalents thereto.

What is claimed is:

1. A method of forming a silicon germanium conduction channel under a gate stack of a semiconductor device, the method comprising the successive steps of:
   forming the gate stack on a silicon layer formed on an insulating layer;
   growing a silicon germanium layer over said silicon layer;
   forming a second silicon layer over said silicon germanium layer directly after said growing step; and
   heating the device such that germanium condenses in said silicon layer such that a silicon germanium channel is formed across the entire channel of the device between said gate stack and said insulating layer.

2. The method of claim 1, wherein said silicon layer has a thickness of less than 20 mm.

3. The method of claim 1, wherein the fraction of germanium in said silicon germanium layer is between 20 and 50 percent.

4. The method of claim 1, wherein said gate stack comprises spacers.

5. The method of claim 1, wherein said gate stack comprises an insulating layer in contact with said silicon layer.

6. The method of claim 1, wherein said silicon germanium layer is between 50 and 100 nm in thickness.

7. The method of claim 4, wherein the thickness and germanium concentration in the silicon germanium layer are controlled according to the following relation:

$$X_0 \cdot T_i = X \cdot (L_g/2 + L_{sp})$$

wherein $X_0$ is the germanium fraction in the silicon germanium layer, $T_i$ is the thickness of the silicon germanium layer, X is the germanium fraction in the silicon germanium channel, $L_g$ is the gate length of said gate stack and $L_{sp}$ is the width of one of said spacers.

8. A method of forming a channel under a gate of a semiconductor device, the method comprising:
   forming the gate on a first semiconductor layer, the first semiconductor layer comprising a first type of semiconductor;

forming a second semiconductor layer on the first semiconductor layer, the second semiconductor layer comprising a second type of semiconductor;

forming a third semiconductor layer on the second semiconductor layer, the third semiconductor layer comprising the first type of semiconductor; and after forming the third semiconductor layer, increasing a temperature of the semiconductor device such that the second type of semiconductor diffuses from the second semiconductor layer into the first semiconductor layer across the an entire length of the channel; wherein increasing the temperature of the semiconductor device forms an oxide layer on the third semiconductor layer.

9. The method of claim 8, wherein the first type of semiconductor is silicon and the second type of semiconductor is germanium, and wherein the second semiconductor layer comprises silicon and germanium.

10. The method of claim 8, further comprising:
removing the oxide layer.

11. The method of claim 8, wherein the first semiconductor layer has a thickness of less than 20 nm.

12. The method of claim 8, wherein the second semiconductor layer has a thickness of between 50 and 100 nm.

13. The method of claim 8, wherein the first semiconductor layer is formed on an insulating layer, and wherein a gate dielectric is formed between the first semiconductor layer and the gate, and wherein the second type of semiconductor is diffused into an entire thickness of the first semiconductor layer between the insulating layer and the gate dielectric.

14. The method of claim 9, wherein the second semiconductor layer is formed of 20% to 50% germanium.

* * * * *

UNITED STATES PATENT AND TRADEMARK OFFICE
CERTIFICATE OF CORRECTION

PATENT NO. : 7,687,356 B2
APPLICATION NO. : 11/714063
DATED : March 30, 2010
INVENTOR(S) : Philippe Coronel et al.

It is certified that error appears in the above-identified patent and that said Letters Patent is hereby corrected as shown below:

Claim 2, col. 4, line 43, should read:
thickness of less than 20 nm.

Signed and Sealed this

Eleventh Day of May, 2010

David J. Kappos
*Director of the United States Patent and Trademark Office*